(12) United States Patent
Kreider et al.

(10) Patent No.: US 6,500,691 B2
(45) Date of Patent: Dec. 31, 2002

(54) IMAGE SENSOR AND METHOD OF MANUFACTURING SAME

(75) Inventors: Gregory Lee Kreider, Eindhoven (NL); Hermanus Leonardus Peek, Eindhoven (NL); Wilco Klaassens, Eindhoven (NL)

(73) Assignee: Koninklijke Philips Electronics, Eindhoven (NL)

( * ) Notice: Subject to any disclaimer, the term of this patent is extended or adjusted under 35 U.S.C. 154(b) by 0 days.

(21) Appl. No.: 09/946,716

(22) Filed: Sep. 5, 2001

(65) Prior Publication Data

US 2002/0056860 A1 May 16, 2002

(30) Foreign Application Priority Data

Sep. 5, 2000 (EP) .............................................. 00203052

(51) Int. Cl.[7] .............................................. H01L 21/00
(52) U.S. Cl. ......................................... 438/60; 257/464
(58) Field of Search ......................... 257/414, 431–466; 438/57–59, 66–67, 60

(56) References Cited

U.S. PATENT DOCUMENTS

| | | | | |
|---|---|---|---|---|
| 4,450,484 A | * | 5/1984 | Terakawa et al. ........... | 348/249 |
| 5,210,049 A | | 5/1993 | Anagnostopoulos ......... | 437/53 |
| 5,483,090 A | | 1/1996 | Kitamura et al. ........... | 257/231 |

FOREIGN PATENT DOCUMENTS

EP 0625800 A1 11/1994

OTHER PUBLICATIONS

"Soft W–Ray Spectroscopy with Sub–electron Readnoise Charge–Coupled Devices", by R.P. Kraft et al., Nuclear Insruments and Methods in Physics Research, Vol. A361, 1995, pp. 372–383.

* cited by examiner

Primary Examiner—Chandra Chaudhari
Assistant Examiner—Craig Thompson
(74) Attorney, Agent, or Firm—Laurie E. Gathman

(57) ABSTRACT

The image sensor comprises a semiconductor body (1) having gate electrodes (3, 4) at a surface (2), each gate electrode being combined with the semiconductor body (1) and an intermediate dielectric (14) so as to form a MOS capacitor (5), which gate electrodes (3, 4) include a portion (6) which is thinner than a surrounding zone (7), a photosensitive region (8) in the semiconductor body (1) being situated below each gate electrode (3, 4), said photosensitive region (8) being capable of absorbing electromagnetic radiation and converting said radiation to electric charge. The MOS capacitors (5) are arranged next to each other so as to form an array (9), with the gate electrodes (3, 4) in a row (10) electrically contacting each other, and the gate electrodes (3, 4) in a column (11) being mutually separated only by electrically insulating material (12). The image sensor has an improved photosensitivity, particularly for electromagnetic radiation with a short wavelength.

13 Claims, 5 Drawing Sheets

IMAGE SENSOR AND METHOD OF MANUFACTURING SAME

The invention relates to an image sensor comprising a semiconductor body which is provided, at a surface, with electrodes, each electrode being combined with the semiconductor body and an intermediate dielectric so as to form a MOS capacitor, which electrodes have a portion which is thinner than a surrounding zone, a photosensitive region in the semiconductor body being situated below each electrode, which photosensitive region is capable of absorbing electromagnetic radiation and converting said electromagnetic radiation to electric charge.

The invention also relates to a method of manufacturing an image sensor comprising a semiconductor body which is provided, at a surface, with electrodes, each electrode being combined with the semiconductor body and an intermediate dielectric so as to form a MOS capacitor, second electrodes having a portion which is thinner than a surrounding zone, a photosensitive region in the semiconductor body being situated below each electrode, which photosensitive region is capable of absorbing electromagnetic radiation and converting said radiation to electric charge, first electrodes being formed from a first layer of polysilicon, and insulation being provided between the first electrodes and the second electrodes.

A method of manufacturing such an image sensor is known from U.S. Pat. No. 5,210,049. In the known method, an image sensor is manufactured, which image sensor comprises, inter alia, a matrix of pixels and a CCD shift register. A pixel comprises a photocapacitor, a transfer gate and an overflow gate. Below each electrode of the photocapacitor there is a photosensitive region in the semiconductor body, which photosensitive region absorbs electromagnetic radiation and converts it to electric charge. Said electric charge can be displaced via the transfer gate and read via a shift register. If too much charge is converted in a pixel, a part of the charge is removed via the overflow gate. To increase the light sensitivity of the photocapacitor, the light-receiving electrode is locally made thinner. The absorption of short-wave electromagnetic radiation, in particular the blue light of the visible spectrum, is substantially reduced thereby.

In the known method, a conductive region is formed in a semiconductor body. dielectric is provided on the semiconductor body. On the dielectric, a first layer of conductive polycrystalline Si is applied above the conductive region, from which the transfer gate and the overflow gate are formed. After the application of insulating material, a second layer of conductive polycrystalline Si is applied above the conductive region, from which the electrodes of the photocapacitors and the electrodes of the shift register are simultaneously formed. The uppermost electrode of the photocapacitor is locally reduced in thickness to a value at which the absorption and losses caused by interference of incident light are reduced, so that the amount of light reaching the conductive region and the region of the semiconductor below the conductive region increases. The uppermost electrode of the photocapacitor is locally reduced in thickness by means of a pattern in a resist layer and by etching the second conductive polysilicon layer in the apertures of the resist pattern.

A drawback of the known image sensor resides in that the photocapacitors, the transfer gates and the overflow transfer gates take up a comparatively large Si semiconductor surface. The photosensitive part formed by the photocapacitors is only a small part of the overall surface of the image sensor. The sensitivity of the image sensor to, in particular, short-wave electromagnetic radiation is small.

An additional disadvantage resides in that the thickness of the thin portion of the electrodes of the photocapacitors is difficult to control. As a result of the topography of the first transfer gate and the overflow gate, on top of which the second polysilicon layer is deposited, the step coverage depends substantially upon the space between the transfer gate and the overflow gate and the thickness of the first polysilicon layer. The second polysilicon layer is a very thick layer having a thickness of several microns. The thickness of the thick layer can be locally reduced to 50 nm by subjecting it to an etching operation, however, such an etching operation is poorly reproducible and leads to the introduction of a large spread. As the thickness of the thin polysilicon is not uniform, the sensitivity of the pixels varies substantially.

It is an object of the invention to provide an image sensor of the type described in the opening paragraph, which image sensor has a greater sensitivity to electromagnetic radiation, in particular short-wave electromagnetic radiation.

A further object of the invention is to provide a method of manufacturing an image sensor of the type described in the opening paragraph, which image sensor has a greater sensitivity, can be manufactured more readily and is more reliable.

In the device in accordance with the invention, this object is achieved in that the MOS capacitors are arranged next to each other in a matrix array, the electrodes in a row being interconnected and electrically contacting each other, and the electrodes in a column being separated only by electrically insulating material.

As the MOS capacitors are interconnected in a row and, in the column direction are very closely spaced, substantially the entire photosensitive surface is covered with electrodes. The electrodes comprise a comparatively large thinner portion in order to absorb more electromagnetic radiation in the photosensitive regions, which electromagnetic radiation is converted to electric charge. The photosensitivity to, in particular, short-wave electromagnetic radiation is improved substantially by increasing the photosensitive surface. By means of the electrode of a MOS capacitor, the charge is collected below the electrode. A larger photosensitive surface does not only increase the sensitivity but also the charge-storage capacity of a pixel. By virtue thereof, the signal-to-noise ratio of the image sensor is improved, as a result of which, ultimately, the image can be sharper and brighter.

In order to be able to sufficiently rapidly read the charge below each electrode of the MOS capacitor using a clock signal of, for example, 1 MHz, the delay caused by the RC time may not become excessively long. The interconnected electrodes in a row electrically contact each other and determine the resistance. By providing the electrodes with thicker portions around the thinner portions, the resistance is reduced substantially. It is very favorable that, by means of said thick portions of the electrodes, it becomes possible to just reach the clock rate, and the remaining surface of the electrodes is very thin in order to allow as much electromagnetic radiation as possible to pass to the photosensitive regions.

Advantageously, the locally thinner portion of each electrode is centered in the relevant electrode so as to preclude, to the extent possible, reflections of light at the edges between different media and any differences in thickness at the edges of the polysilicon electrodes. In addition, thicker edge portions of the electrodes are very favorable because, in general, the current densities that can be attained along edges are larger than in the center, leading to a reduction of the resistance of the electrodes. In addition, it is advantageous if as much as possible of the electromagnetic radiation lands on the photosensitive regions, i.e. the so-called channels for the charge transport. The photosensitive regions are bounded in the horizontal directions by zones of a different doping type. Depletion regions develop between the two doping regions. The zones and the depletion regions at the edges of the electrodes are less suitable for converting electromagnetic radiation to electric charge. Therefore, it is favorable for the locally thinner portion of each electrode to be centered.

Favorably, the locally thinner portion of each electrode covers at least 25% of each electrode surface. The amount of charge converted per pixel in the course of a certain integration period is typically several ten thousand times larger than the charge caused by the dark current. To attain a good signal-to-noise ratio, it is thus advantageous for the thin portion of the electrodes to be as large as possible. After each integration period, the charge packets are transported, in the CCD manner, through the channels towards a horizontal readout register. During the transport of the charge packets through the channels towards the horizontal read-out register, also light is absorbed and converted. This leads to the formation of noise on the signal. Consequently, reading must take place rapidly, for example at a clock frequency of several MHz. The zone surrounding the thin portion of the electrodes preferably covers only such a part of the surface of the electrodes as is necessary to achieve a sufficiently low resistance, while the remaining surface of the electrodes is thin. In general, the read-out velocity is sufficient if the surrounding zones of the electrodes cover up to 25% of the surface area.

Advantageously, the charge below an electrode can be displaced during a clock signal on the same electrode. In a Frame Transfer (FT) image sensor, an image is stored in the imaging portion of the CCD sensor during a certain integration time, and, subsequently, said image is rapidly transported by a clock signal on the electrodes to a memory portion of the CCD sensor where it is read out line by line. In the FT sensor, the charge-sensitive region also forms the charge-transfer layer. The gate extends throughout the region, resulting in an optimum charge control. The object of the invention as regards the method is achieved, in accordance with the invention, in that a second layer of polysilicon is reduced in thickness to substantially the same thickness as that of the first polysilicon layer, and thinner portions are formed in all electrodes by etching the polysilicon.

A very short distance between the first and second electrodes can be achieved, for example, by thermal oxidation of the first polysilicon electrodes, resulting in the formation of a thin insulation layer of $SiO_2$. By reducing the thickness of the second layer of conductive polysilicon so as to be the same as the thickness of the polysilicon layer that is applied first, a matrix of very closely spaced substantially equally thick electrodes is obtained. As there are hardly any differences in topography, it is possible, using a resist pattern wherein apertures are defined above the polysilicon electrodes, to etch the polysilicon with very great accuracy and little spread at the location of these apertures. In addition, only a small amount of polysilicon has to be etched, so that the etch time can remain short, the thickness of the remaining polysilicon can be very accurately controlled and the spread in thickness is small. The uniformity between the pixels is improved substantially. It is possible to first etch the polysilicon through the apertures in a resist pattern above the first electrodes, remove the resist and, subsequently, using a different mask, etch the polysilicon through the apertures in a resist pattern above the second electrodes. This enables the uniformity between the pixels to be further improved. As the thickness of the thin portions of the polysilicon electrodes varies very little, the thickness of the thin portions of the electrodes can be further reduced. This is very advantageous because the quantum efficiency with which, in particular, short-wave electromagnetic radiation is converted to electric charge, increases very substantially as the thickness of the polysilicon decreases.

Preferably, the apertures in the center of the polysilicon electrodes are etched. As the second layer of polysilicon follows the topography of the first electrodes there is always a difference in thickness, as a result of the step coverage, between the polysilicon on the edges and the polysilicon in the central portion of the second electrodes to be formed. As a result of the variation in thickness of the polysilicon at the edges of the second electrodes, the best uniformity of the thin portions is achieved in the center of the electrodes.

It is cheap to form the thinner portions of the electrodes simultaneously. In this case, only one exposure step of the resist through a mask is required and an etch step to etch the apertures in the polysilicon electrodes.

By oxidizing the electrodes, the thin polysilicon portion of the electrodes can be reduced in thickness. Reducing the thickness of the polysilicon electrodes by oxidation, for example in $O_2$, can be carried out even more accurately and uniformly than removing polysilicon by etching. In addition, oxidation is a much slower process, so that a better control of the thin portion of the polysilicon electrode is obtained.

Similarly, the thickness of the polysilicon electrodes can be reduced in a very accurate manner by nitridation. During thermal nitridation of polysilicon in, for example, $N_2O$ or NO, the polysilicon surface is very slowly consumed, thereby forming $Si_3N_4$.

Favorably, the thin portion of the gate is surrounded by substantially perpendicular walls of the thick portion of the gate. As the walls are steeper, the amount of light reflected by the walls decreases, and non-uniformities caused by adsorption differences on the walls of the different pixels are minimal.

Advantageously, the thin portion of the electrode has a maximum thickness of 50 nm. The absorption of short-wave electromagnetic radiation in the polysilicon electrode is substantially reduced below 50 nm, as a result of which the sensitivity to blue light increases substantially. The sensitivity to blue light determines the brightness of the pixels. The brightness of the pixels increases substantially as the amount of blue light absorbed in the electrodes decreases.

Advantageously, the thick portion of the polysilicon has a minimum thickness of 250 nm. A low resistance of the electrodes is advantageous because it enables the matrix to be read at a high clock rate. A low resistance of the electrodes corresponds with a low sheet resistance. The sheet resistance is defined as the specific resistance of a layer divided by the thickness of the layer. A matrix of, for example, 3 k by 2 k pixels and a clock rate of 1 MHz typically has an electrode resistance of several hundred Ohm. This corresponds to a minimum thickness of 250 nm for a properly conducting polysilicon having a specific resistance of typically $10^{-4}$ Ohmcm.

These and other aspects of the invention will be apparent from and elucidated with reference to the embodiment(s) described hereinafter.

IN THE DRAWINGS

FIG. 2 shows the steps in the method of manufacturing the image sensor, FIGS. 2a through 2e showing cross-sectional views of the intermediate products;

The CCD image sensor shown in FIG. 1 a comprises an image pick-up portion A and a read-out register B. The image pick-up portion A comprises a part of semiconductor body 1 which is provided, at a surface 2, with electrodes 3, 4, each electrode being combined with the semiconductor body 1 and an intermediate dielectric 14 so as to form a MOS capacitor 5. The electrodes 3, 4 include a portion 6 which is thinner than a surrounding zone 7. Below each electrode 3, 4 there is a photosensitive region 8 in the second conductor body 1, which photosensitive region is capable of absorbing electromagnetic radiation and converting said radiation to electric charge. The MOS capacitors 5 are arranged next to each other in a matrix 9, the electrodes 3, 4 being interconnected in a row 10 and electrically contacting each other, and said electrodes 3, 4 being separated from each other in a column 11 by only electrically insulating material 12.

Figure 1A:
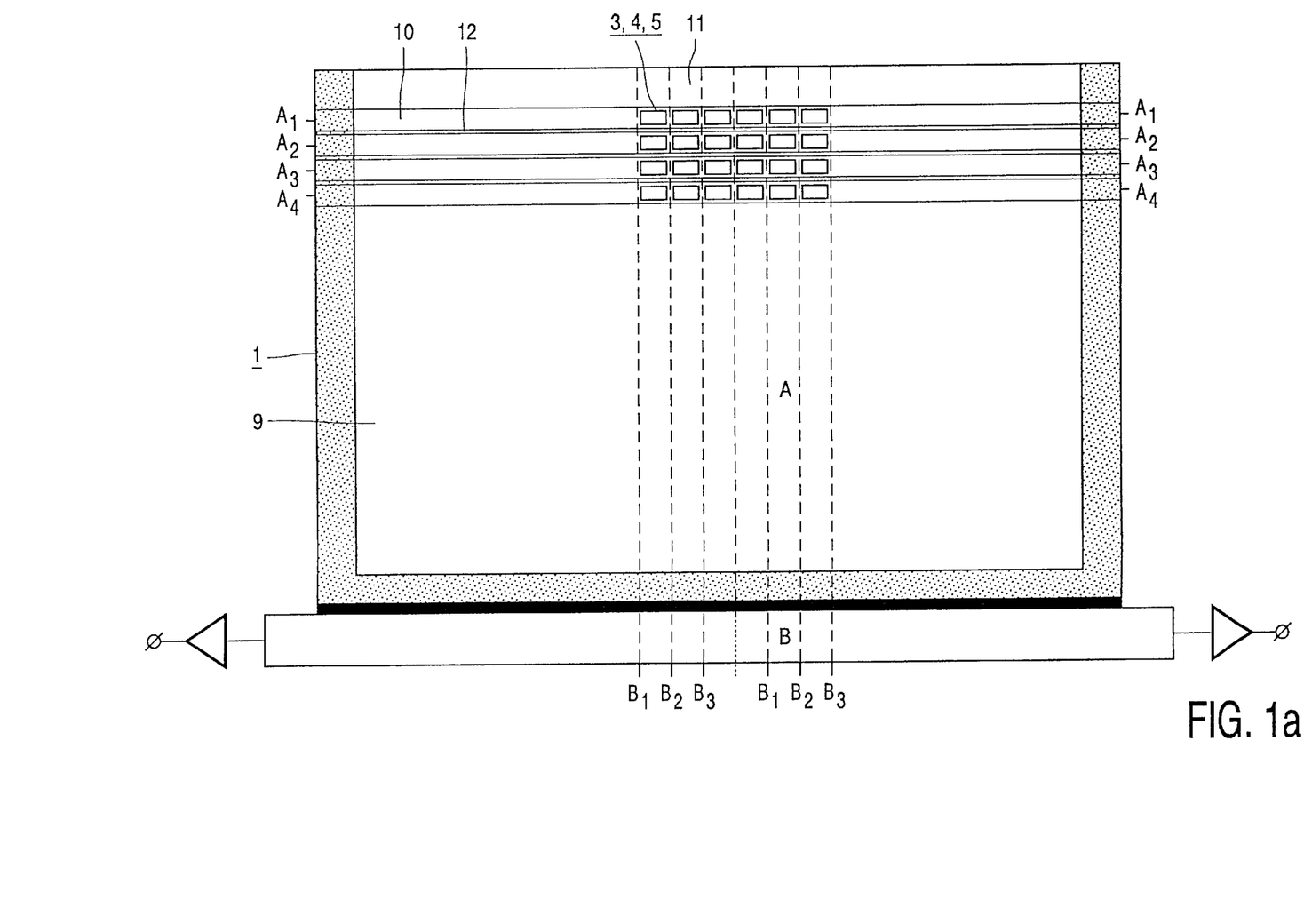
FIG. 1a diagrammatically shows an embodiment of the image sensor wherein the invention is embodied.

The photosensitive regions 8 in the Si semiconductor body 1, the so-called CCD channels, are separated from each other in the horizontal direction by implanted regions 30 of a different doping type. Electrodes 3, 4 are provided over said channels, so as to extend perpendicularly thereto, in order to control the charge storage and charge transport in the channels.

In this embodiment, the electrodes 3, 4 are depicted over a part of the image pick-up portion A of the CCD, where four clock signals A1–A4 are presented. In operation, the radiation incident on the image pick-up portion A is integrated for a certain period of time, i.e. the integration period. The charge generated during this period of time is stored in the semiconductor body below the electrodes 3, 4 in the form of discrete charge packets, and, subsequently, said charge is transported from the imaging portion A, possibly via a memory portion, to the horizontal read-out register B. In this embodiment, use is made of 3 horizontal clock signals B1–B3 enabling the memory to be read out column by column. The horizontal read-out register is divided into two parts, so that reading out can take place on the left-hand side as well as on the right-hand side.

Figure 1B:
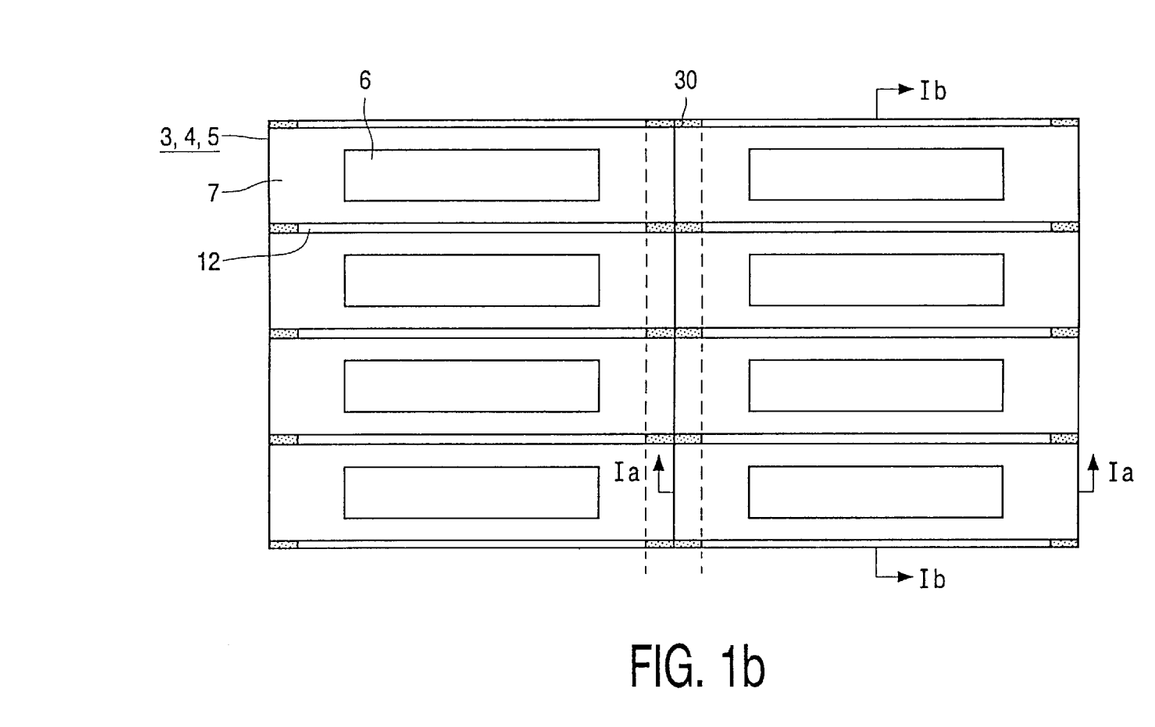
FIG. 1b is a plan view of the imaging portion of the embodiment of the image sensor shown in FIG. 1.
Figure 1C:
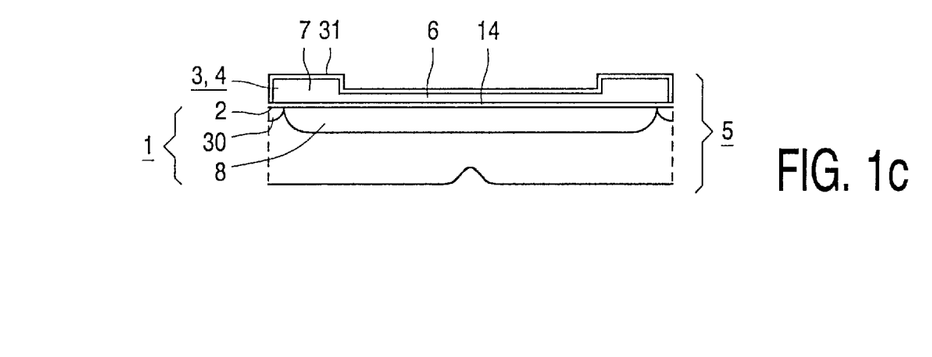
FIG. 1c is a cross-sectional view of the imaging portion of the embodiment of the image sensor according to 1a—1a in FIG. 1b.

In the Si semiconductor body 1, the photosensitive regions 8 are situated at or just below the surface 2 and are separated from each other by implanted regions 30, which are indicated by means of dotted lines in FIG. 1b. In this embodiment, the photosensitive regions 8 are formed by an n-type implantation of As or P and diffusion in a p-well of, for example, B on an n-type substrate, see FIG. 1c. The regions 30 are p-type doped with, for example, B. In the imaging portion A of the image sensor, the electrodes 3, 4 comprise a portion 6 which is thinner than a surrounding zone 7. As the radiation must penetrate the electrodes 3, 4 at least partly, the thinner portions of the properly conducting polysilicon electrodes 3, 4 are typically 50 nm thick in order to minimize sensitivity losses caused by absorption in the electrodes 3, 4. On the other hand, it is desirable to preserve the larger thickness of the surrounding zones 7 of the electrodes 3, 4, i.e. a thickness of typically about 350 nm, because of the resistance of the electrodes 3, 4. It is important to operate the electrodes 3, 4 at the highest possible clock rate in order to transport the charge as rapidly as possible to preclude smearing of charge, which is caused by the fact that charge is also integrated during transport. The maximum frequency is substantially determined by the resistance of the electrodes 3, 4. Therefore, the transport rate is higher and the degree of smearing smaller as the electrodes 3, 4 are thicker.

Figure 1D:
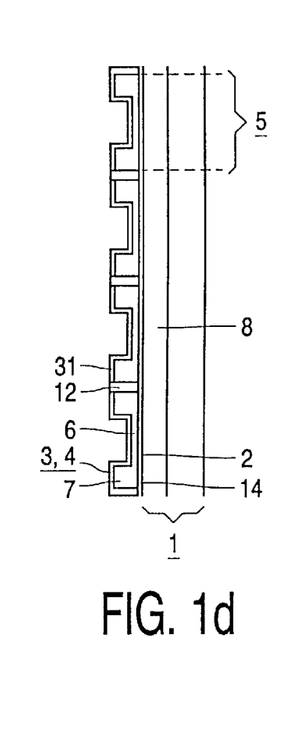
FIG. 1d is a cross-sectional view of the imaging portion of the embodiment of the image sensor taken on the line 1b—1b in FIG. 1b.

In the column direction, see FIG. 1d, the electrodes are mutually separated by insulating material only. The minimum thickness of the insulating material is such that the electrodes 3, 4 cannot cause a short-circuit. The thickness of the insulating material is as small as possible, so that an electrode is capable of slightly influencing the potential between an adjoining capacitor below the insulating material in the charge transfer direction of the CCD.

In this embodiment, the thinner portion 6 of each electrode is centered in the relevant electrode. The largest amount of charge is generated in the center of the electrodes 3, 4. By virtue thereof, losses caused by recombination in depletion regions between the implanted regions 30 and the photosensitive regions 8 in the Si semiconductor body 1 are absent.

In the embodiment shown, the locally thinner portion 6 of each electrode covers approximately 25% of the electrode surface. In order to attain a certain clock rate, the RC time must be limited. In addition, it is favorable for the light-sensitive surface of the electrodes to be as large as possible. In a given configuration of the electrodes, and at given layer thicknesses of, for example, the gate dielectric 14, the optimum size of the thin portion 6 and the maximum permissible resistance of an electrode can be calculated. In order to make sure that the resolution of the image sensor is sufficient, it is favorable for the light-sensitive regions to be as closely spaced as possible. The thin portion of each electrode thus covers preferably more than 25% of the overall surface of each electrode.

The charge below an electrode can be moved in the direction of the channels during a clock signal on the same electrode. In the case of a p-channel CCD, each negative voltage pulse of the clock signal on the electrode causes the charge, in this case holes, to move up one position in the direction of the horizontal register. It is possible, however, to produce an n-channel CCD. A positive voltage pulse of the clock signal causes the charge, in this case electrons, to be moved through a channel in the direction of the horizontal register.

In FIG. 2, corresponding parts bear the same reference numeral as in FIG. 1. In FIG. 2a, first electrodes 3 are formed from a first layer of polysilicon 15. In an Si substrate, n-type photosensitive regions 8 are formed, which are bounded by p-type channels 30, i.e. the channel stoppers. On the surface 2 of the semiconductor body 1, a gate dielectric 14 is provided which is composed of, for example, 50 nm $SiO_2$ and 60 nm $Si_3N_4$. A polysilicon layer 15 having a thickness of, for example, 0.55 $\mu$m is deposited on the gate dielectric by means of a CVD technique. The polysilicon can be doped in situ, during or after the deposition, by implantation. The first electrodes 3 are formed by applying a resist layer to the polysilicon layer 15. The resist is exposed through a mask. After it has been developed, the resist is removed at the exposed locations, as a result of which a resist pattern is obtained. For the etching operation use can be made of a wet chemical or reactive-ion etching process. The first electrodes 3 have a length of typically 3 $\mu$m and a pitch of 6 $\mu$m. By virtue of the excellent etch selectivity between polysilicon and $Si_3N_4$, the $Si_3N_4$ is hardly affected.

Figure 2A:
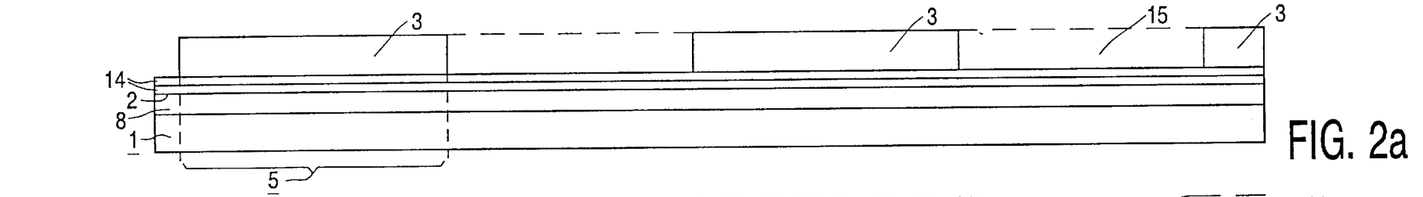
FIG. 2a is a cross-sectional view of the intermediate product after the formation of first electrodes.
Figure 2B:
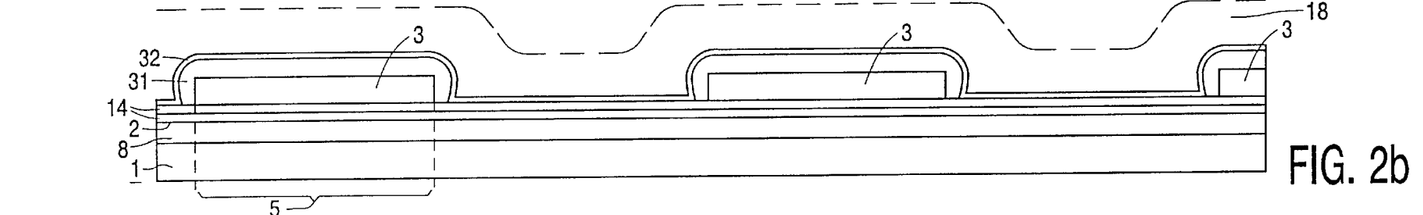
FIG. 2b is a cross-sectional view of the intermediate product after oxidation and nitride deposition.

Subsequently, the polysilicon of the first electrodes 3 is thermally oxidized to a thickness 20 of typically 0.3 $\mu$m, resulting in the formation of an $SiO_2$ layer 31 at the polysilicon surface (FIG. 2b). Optionally, also a layer of nitride 32 can be deposited in a thickness of, for example, 20–40 nm. In this case, the thickness of the polysilicon layer 15 is adapted so as to be typically 0.45 $\mu$m. Next, a second layer of conductive polysilicon 18 is deposited in a thickness of 0.45 $\mu$m in the same manner as the first layer of conductive polysilicon 15.

Figure 2C:
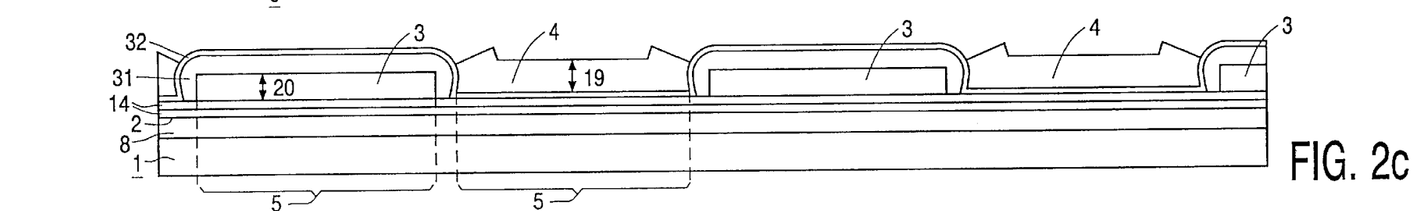
FIG. 2c is a cross-sectional view of the intermediate product after etching the second layer of conductive polysilicon.
Figure 2D:
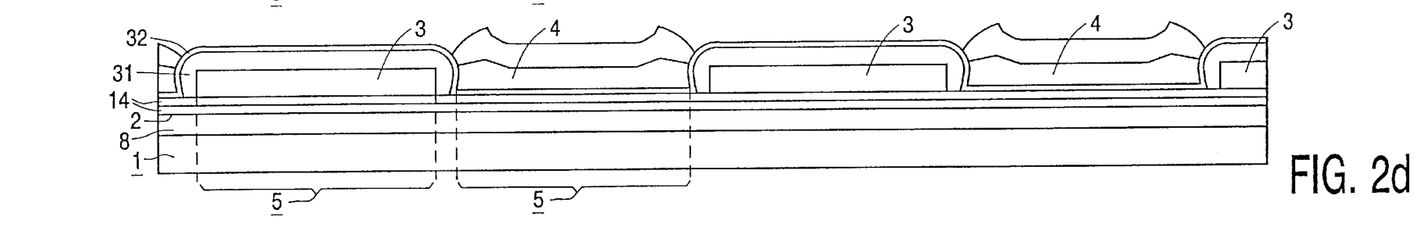
FIG. 2d is a cross-sectional view of the intermediate product after oxidation.
Figure 2E:
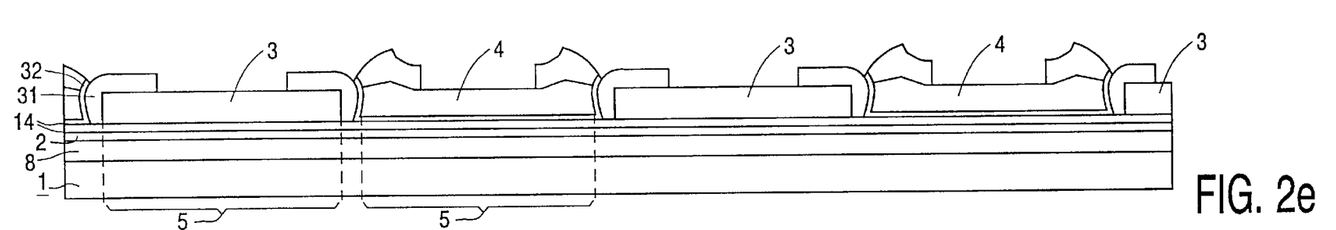
FIG. 2e is a cross-sectional view of the intermediate product after etching an aperture in the $SiO_2$.
Figure 2F:
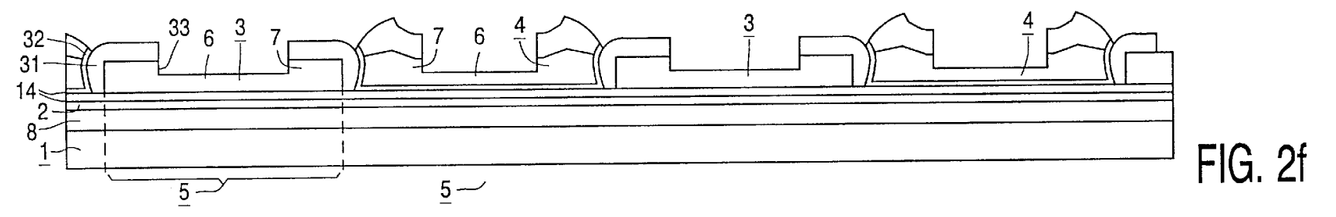
FIG. 2f is a cross-sectional view of the intermediate product after etching the polysilicon.

The second electrodes 4 are formed in that the second layer of conductive polysilicon 18 is reduced to substantially the same thickness 19 as the thickness 20 of the first layer of polysilicon 15 (FIG. 2c). The reduction of the thickness 19 of the second layer of polysilicon 18 can be achieved, for example, by means of chemical-mechanical polishing and etching, or by means of lithography and etching, as described in U.S. Pat. No. 5,541,133. The second electrodes 4 are situated between the first electrodes 3. The electrodes 3, 4 are thermally oxidized to a thickness of approximately 0.25 $\mu$m (FIG. 2d). If a nitride layer 32 is deposited, said nitride layer 32 is etched from the surface. A resist layer is provided with a pattern by means of a mask through which exposure and the subsequent development of the resist take place. In the openings in the resist, the $SiO_2$ is etched, for example in a $CF_4$ plasma (FIG. 2e). By virtue of the satisfactory etch selectivity of $SiO_2$ with respect to poly Si, the polysilicon remains substantially unaffected. Preferably the resist is removed prior to the formation of the thinner portions 6 in all electrodes 3, 4 by means of etching the conductive polysilicon (FIG. 2f). If the thin portions 6 of the electrodes 3, 4 are typically 50 nm thick, then the spread in thickness typically is a few percent. As a result of differences in thickness between the first electrodes 3 and the second electrodes 4, it may be advantageous if the thinner portions 6 can be separately etched in the polysilicon. In this case, first the openings in the $SiO_2$ on top of the first electrodes 3 are etched and subsequently the polysilicon of the first electrodes 3 is etched. Subsequently, a second resist pattern is used to etch openings in the $SiO_2$ on top of the second electrodes 4, after which the polysilicon is etched in the apertures. Subsequently, the resist is removed.

Preferably, the apertures are etched in the center of the polysilicon electrodes. As a result of thickness variations in the polysilicon at the edges of the electrodes (FIG. 2e), the highest uniformity between the thin portions is achieved in the center of the electrodes 3,4.

Figure 2G:
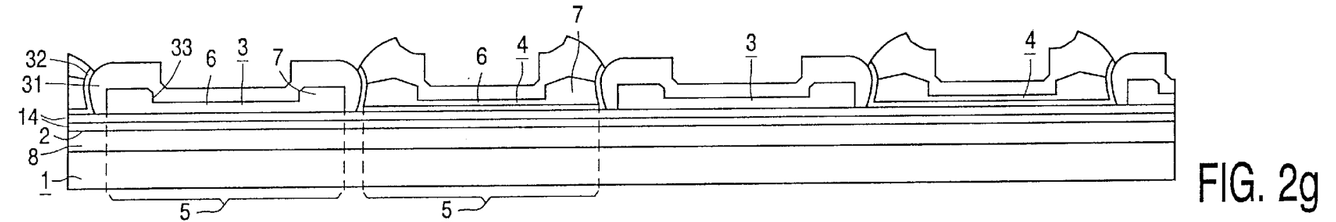
FIG. 2g is a cross-sectional view of the intermediate product after an oxidation step wherein the polysilicon electrodes are further reduced in the thickness.

The thickness of the layer of conductive polysilicon of the electrodes 3, 4 can be reduced by oxidation (FIG. 2g). During a thermal oxidation operation, polysilicon at the surface is converted to $SiO_2$. The growth rate is accurately controlled and very uniform, as a result of which the thickness of the thin portions 6 of the electrodes 3, 4 can be very accurately adjusted. The spread in thickness as a result of oxidation is typically 1%. The thickness of the layer of conductive polysilicon of the electrodes can be reduced in a similar manner by nitridation. During a thermal nitridation operation, polysilicon at the surface is converted to $Si_3N_4$. Said conversion of polysilicon to $Si_3N_4$ takes place at an even lower rate than the above-described formation of $SiO_2$, as a result of which the thin portion 6 of the electrodes 3, 4 can be very uniformly reduced in thickness.

In order to preclude reflections and absorption differences between the pixels, the thin portions 6 of the electrodes 3, 4 are advantageously surrounded by substantially perpendicular walls of the surrounding zones 7. By means of anisotropic etching using, for example, a gas mixture of $Cl_2$, HBr and He at a pressure of 100 mTorr and a power of 300 Watt, substantially perpendicular walls can be etched in the polysilicon. As described hereinbefore, a hard mask of $SiO_2$ is used.

Figure 3:
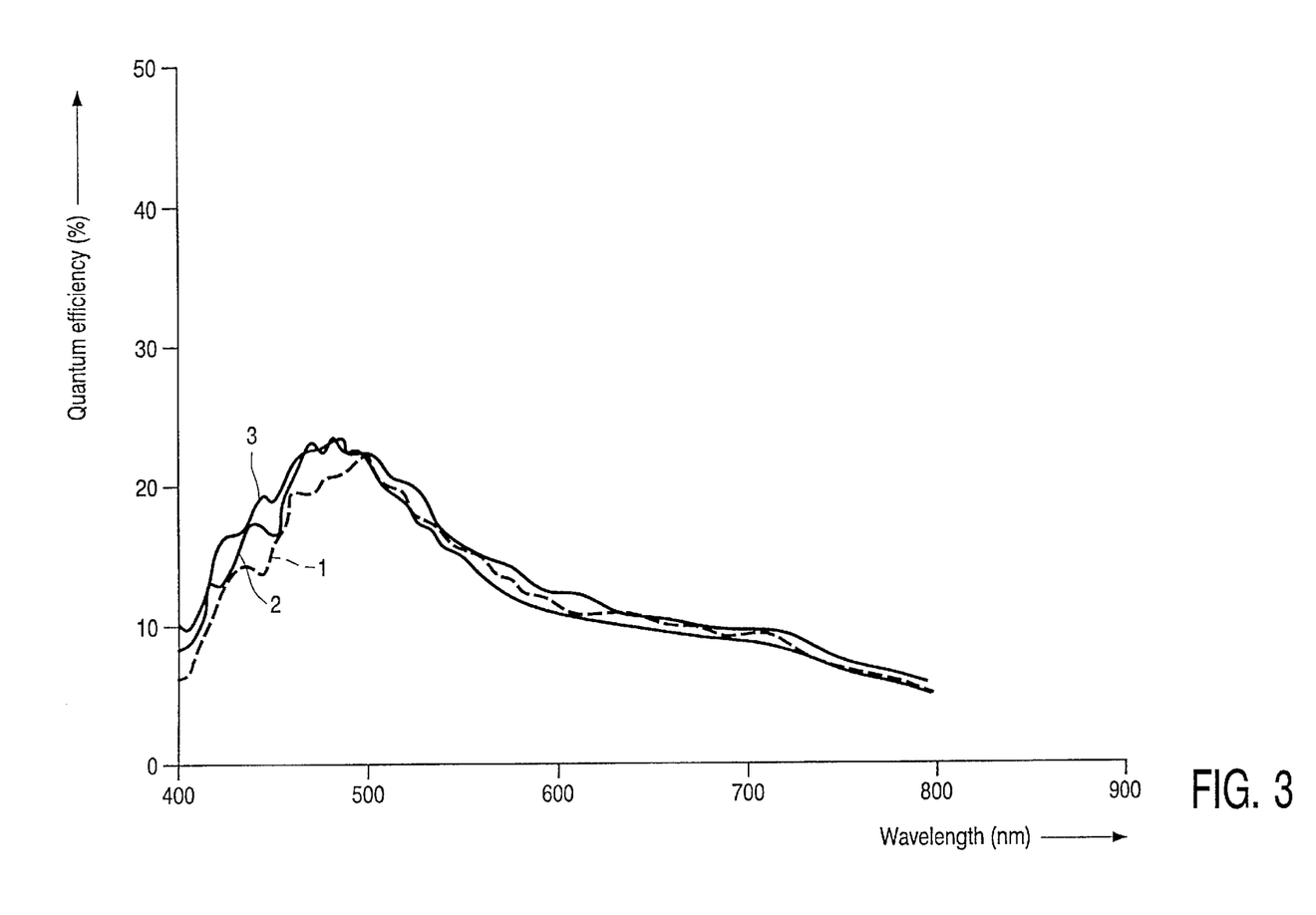
FIG. 3 shows an experimental result of the quantum efficiency as a function of the wavelength for various thicknesses of the thin portions of the polysilicon electrodes.

By choosing the thickness of the thin portions 6 of the electrodes to be maximally 50 nm, in this embodiment, the quantum efficiency in the photosensitive region of the semiconductor body is at least 14% for short-wave electromagnetic radiation ($\lambda$=450 nm). FIG. 3 shows a substantial increase of the quantum efficiency for short-wave electromagnetic radiation ($\lambda$=450 nm) if the thickness of the thinner portions 6 of the electrodes 3, 4 decreases from 50 nm (curve 2) to approximately 10 nm (curve 3). In the reference curve (curve 1), the thickness of the electrodes is 300 nm.

To make sure that the resistance of the electrodes does not become excessively high, the properly conducting polysilicon has a specific resistance of typically $10^{-4}$ Ohmcm. To make sure that the sheet resistance of the highly doped polysilicon layer does not exceed 400 Ohm/square, the minimum thickness of the thick portion of the electrodes is 250 nm. Preferably, the thickness is chosen to be larger than 250 nm in order to reduce the resistance of the electrodes.

What is claimed is:

1. An image sensor comprising:
   a semiconductor body;
   at a surface of the semiconductor body, electrodes each forming, with the semiconductor body and an intermediate dielectric, an MOS capacitor, the electrodes having a portion which is thinner than a surrounding zone;
   a photosensitive region in the semiconductor body below each electrode, the photosensitive region capable of absorbing electromagnetic radiation and converting said electromagnetic radiation to electric charge,
   wherein the MOS capacitors are arranged next to each other in a matrix array in which the electrodes in a matrix row are interconnected and electrically contact each other and the electrodes in a matrix column are separated only by electrically insulating material.

2. An image sensor as claimed in claim 1, wherein the thinner portion of each electrode is centered in the relevant electrode.

3. An image sensor as claimed in claim 1, wherein the thinner portion of each electrode covers at least 25% of the relevant electrode surface.

4. An image sensor as claimed in claim 1, wherein the electric charge below each electrode can be moved when a clock signal is applied to the relevant electrode.

5. A method of manufacturing an image sensor comprising:

forming first and second electrodes on a semiconductor body at a surface thereof, each electrode forming, with the semiconductor body and an intermediate dielectric, an MOS capacitor, each second electrode having a portion which is thinner than a surrounding zone, wherein a photosensitive region in the semiconductor body is situated below each electrode, the photosensitive region capable of absorbing electromagnetic radiation and converting said electromagnetic radiation to electric charge, wherein the first electrodes are formed from a first layer of polysilicon, insulation is provided between the first electrodes and the second electrodes, and wherein a second layer of polysilicon employed in forming the electrodes is reduced to substantially the same thickness as the thickness of the first layer of polysilicon employed in forming the electrodes, and the thinner portions are formed in all electrodes by etching said polysilicon.

6. The method as claimed in claim 5, the thinner portions of the electrodes are formed simultaneously.

7. A method as claimed in claim 5, wherein the thinner portions of the electrodes are etched in the center of the relevant electrode.

8. A method as claimed in claim 5, wherein the thickness of the polysilicon layers of the electrodes decreases as a result of oxidation.

9. A method as claimed in claim 5, wherein the thickness of the polysilicon layers of the electrodes decreases as a result of nitridation.

10. A method as claimed in claim 5, wherein the thinner portions of the electrodes are surrounded by substantially perpendicular walls of the surrounding zones of the electrodes.

11. A method as claimed in claim 5, wherein the thinner portions of the electrodes are maximally 50 nm thick.

12. A method as claimed in claim 5, wherein the surrounding zones of the electrodes are at least 250 nm thick.

13. An image sensor comprising:

a semiconductor body;

first and second electrodes at a surface of the semiconductor body, each electrode forming, with the semiconductor body and an intermediate dielectric, an MOS capacitor (5), the second electrodes having a portion which is thinner than a surrounding zone;

a photosensitive region in the semiconductor body below each electrode, the photosensitive region capable of absorbing electromagnetic radiation and converting said electromagnetic radiation to electric charge, wherein the first electrodes are formed from a first layer of polysilicon with insulation between the first electrodes and the second electrodes, wherein a second layer of polysilicon employed in the electrodes is reduced to substantially the same thickness as a thickness of the first layer of polysilicon employed in the electrodes, and wherein thinner portions are formed in all electrodes by etching said polysilicon.

* * * * *

UNITED STATES PATENT AND TRADEMARK OFFICE
CERTIFICATE OF CORRECTION

PATENT NO.   : 6,500,691 B2
DATED        : December 31, 2002
INVENTOR(S)  : Gregory L. Kreider et al.

It is certified that error appears in the above-identified patent and that said Letters Patent is hereby corrected as shown below:

<u>Title page,</u>
Item [73], Assignee, should be -- Dalsa Corporation, Ontario Canada --.

Signed and Sealed this

Ninth Day of December, 2003

JAMES E. ROGAN
*Director of the United States Patent and Trademark Office*